United States Patent
Hu et al.

(10) Patent No.: US 11,562,915 B2
(45) Date of Patent: Jan. 24, 2023

(54) METHODS, SYSTEMS, AND APPARATUS FOR OPTICALLY MONITORING INDIVIDUAL LAMPS

(71) Applicant: Applied Materials, Inc., Santa Clara, CA (US)

(72) Inventors: Ji-Dih Hu, San Jose, CA (US); Chaitanya Anjaneyalu Prasad, Cupertino, CA (US); Dongming Iu, Union City, CA (US); Samuel C. Howells, Portland, OR (US); Vilen K. Nestorov, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/582,912

(22) Filed: Jan. 24, 2022

(65) Prior Publication Data

US 2022/0301904 A1   Sep. 22, 2022

Related U.S. Application Data

(60) Provisional application No. 63/163,577, filed on Mar. 19, 2021.

(51) Int. Cl.
*H01L 21/67* (2006.01)
*H05B 47/105* (2020.01)

(52) U.S. Cl.
CPC .. *H01L 21/67242* (2013.01); *H01L 21/67207* (2013.01); *H05B 47/105* (2020.01)

(58) Field of Classification Search
CPC ............ H05B 47/105; H01L 21/67242; H01L 21/67207
See application file for complete search history.

(56) References Cited

U.S. PATENT DOCUMENTS

| | | | |
|---|---|---|---|
| 6,479,801 B1 * | 11/2002 | Shigeoka | G01J 5/0887 392/416 |
| 6,825,437 B2 | 11/2004 | Nakano et al. | |
| 9,735,034 B2 | 8/2017 | Vellore et al. | |
| 10,109,514 B2 | 10/2018 | Vellore et al. | |
| 2002/0006731 A1 * | 1/2002 | Nakano | G01N 21/9501 438/710 |

(Continued)

FOREIGN PATENT DOCUMENTS

| JP | 2001118798 A | 4/2001 |
|---|---|---|
| WO | 2019046054 A1 | 3/2019 |

OTHER PUBLICATIONS

International Search Report and Written Opinion dated May 11, 2022 for Application No. PCT/US2022/013224.

*Primary Examiner* — Raymond R Chai
(74) *Attorney, Agent, or Firm* — Patterson + Sheridan, LLP

(57) ABSTRACT

Methods, systems, and apparatus provide for optically monitoring individual lamps of substrate processing chambers. In one aspect, the individual lamps are monitored to determine if one or more lamps are in need of replacement. A method includes using one or more camera coupled to a borescope to capture a plurality of images of one or more lamps in a substrate processing chamber. The plurality of images is analyzed to identify a change of mean light pixel intensity in an image reference region associated with each lamp. The method includes generating an alert based on the detection of the mean light pixel intensity change.

20 Claims, 8 Drawing Sheets

(56) References Cited

U.S. PATENT DOCUMENTS

| | | | |
|---|---|---|---|
| 2002/0150395 A1* | 10/2002 | Shimizu | H01L 21/67115 219/390 |
| 2006/0098963 A1 | 5/2006 | Shimizu et al. | |
| 2015/0041453 A1* | 2/2015 | Vellore | H01L 21/67115 219/446.1 |
| 2015/0131698 A1 | 5/2015 | Vellore et al. | |
| 2019/0067070 A1* | 2/2019 | Boyd, Jr. | H01J 37/32935 |
| 2019/0320519 A1* | 10/2019 | Kim | G06N 5/022 |

* cited by examiner

… (1) …

METHODS, SYSTEMS, AND APPARATUS FOR OPTICALLY MONITORING INDIVIDUAL LAMPS

CROSS-REFERENCE TO RELATED APPLICATIONS

This application claims benefit of U.S. provisional patent application Ser. No. 63/163,577, filed Mar. 19, 2021, which is herein incorporated by reference in its entirety.

BACKGROUND

Field

Embodiments of the present disclosure relate to methods, systems, and apparatus for optically monitoring individual lamps of substrate processing chambers. In one aspect, the individual lamps are monitored to determine if one or more lamps are in need of replacement.

Description of the Related Art

Lamps used in heating as part of substrate processing operations can degrade and fail, resulting in increased machine downtimes and reduced throughput. Lamp degradation and failure can also hinder device performance. Depending on operations, lamps can fail at differing rates. Noise can also hinder accurate lamp monitoring operations. Certain lamp monitoring operations also can only detect failure of lamps after the lamps have failed. Certain lamp monitoring operations also can be obstructed by substrates being present in the processing chambers.

Therefore, there is a need for improved lamp monitoring methods, systems, and apparatus that facilitate predicting lamp failure to facilitate reduced machine downtime, accurate monitoring, increased throughput, and enhanced device performance.

SUMMARY

Embodiments of the present disclosure relate to methods, systems, and apparatus for optically monitoring individual lamps of substrate processing chambers. In one aspect, the individual lamps are monitored to determine if one or more lamps are in need of replacement.

In one implementation, a method of monitoring a plurality of lamps of a processing chamber includes collecting light emitted by the plurality of lamps, and filtering the light to reduce noise. The method also includes capturing a plurality of images of the light using one or more cameras. Each of the plurality of images includes a plurality of reference regions. Each of the plurality of reference regions corresponds to a respective lamp of the plurality of lamps. The method includes analyzing the plurality of images. The analyzing includes determining a mean light pixel intensity in each of the plurality of reference regions for each of the plurality of images, and detecting a mean light pixel change in a reference region of the plurality of reference regions. The mean light pixel change is a change in the mean light pixel intensity across the plurality of images for the reference region, and the mean light pixel change is larger than a noise level across the plurality of images for the reference region. The method also includes generating an alert based on the detection of the mean light pixel change. The alert indicates a replacement instruction for the respective lamp corresponding to the reference region.

In one implementation, a system for processing substrates includes a processing chamber including a processing volume, a plurality of lamps coupled to the processing chamber, and a lamp window disposed between the plurality of lamps and the processing volume. The lamp window includes a surface that faces the processing volume. The system includes one or more cameras, each respective camera of the one or more cameras being coupled to a borescope disposed through a sidewall of the processing chamber. The borescope has a prism. The system also includes a controller including instructions that, when executed by a processor, cause the prism to collect light emitted by the plurality of lamps. The instructions cause a bandpass filter to filter the light to reduce noise, and the one or more cameras to capture a plurality of images of the light using one or more cameras. Each of the plurality of images includes a plurality of reference regions, and each of the plurality of reference regions corresponds to a respective lamp of the plurality of lamps. The instructions cause the controller to analyze the plurality of images, the analyzing including determining a mean light pixel intensity in each of the plurality of reference regions for each of the plurality of images, and detecting a mean light pixel change in a reference region of the plurality of reference regions. The mean light pixel change is a change in the mean light pixel intensity across the plurality of images for the reference region, and the mean light pixel change is larger than a noise level across the plurality of images for the reference region. The instructions cause the controller to generate an alert based on the detection of the mean light pixel change. The alert indicates a replacement instruction for the respective lamp corresponding to the reference region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to methods, systems, and apparatus for optically monitoring individual lamps of substrate processing chambers. In one aspect, the individual lamps are monitored to determine if one or more lamps are in need of replacement.

Figure 1A:
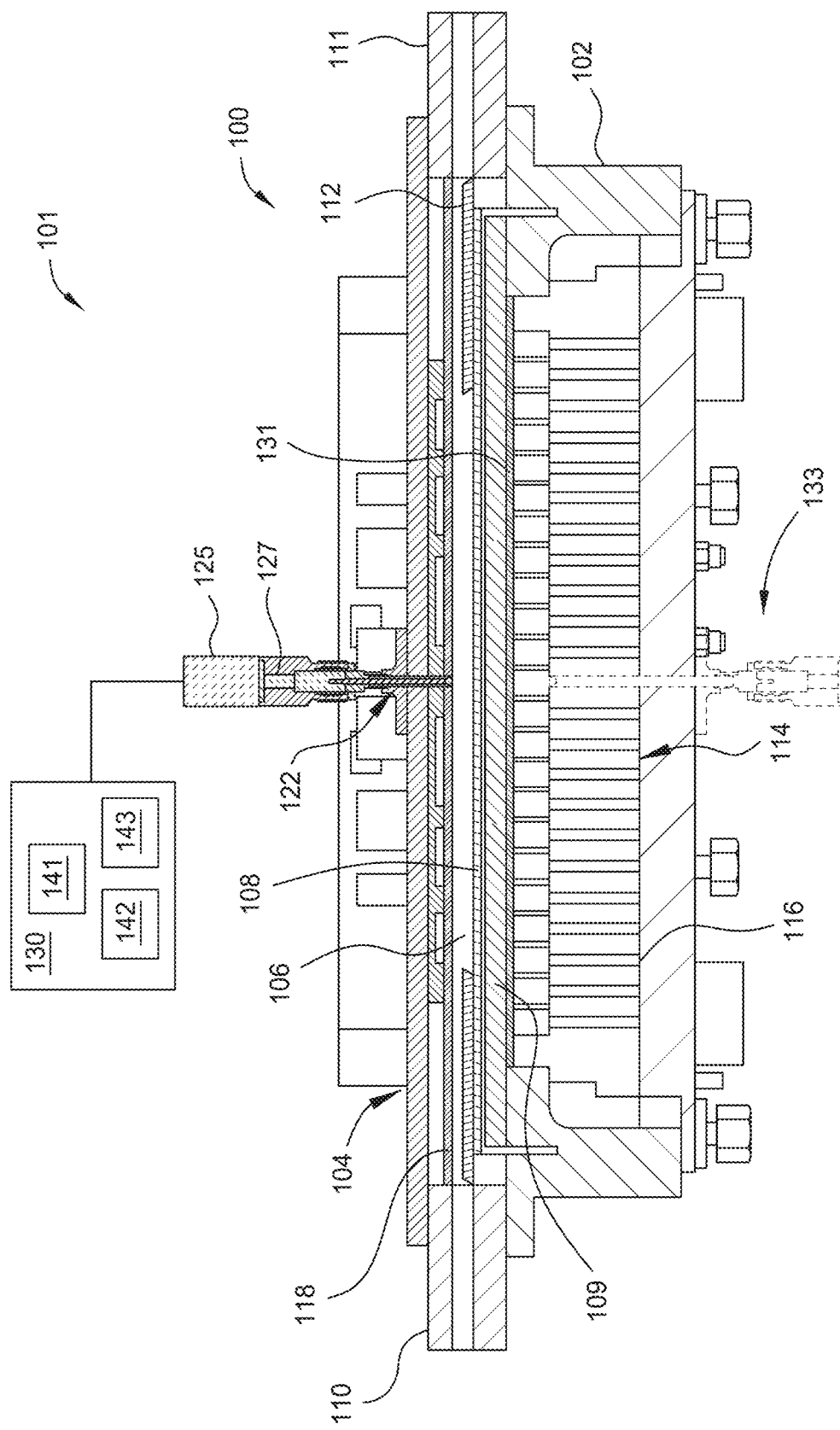
FIG. 1A is a schematic partial cross-sectional view of a system for processing substrates, according to one implementation.
Figure 1B:
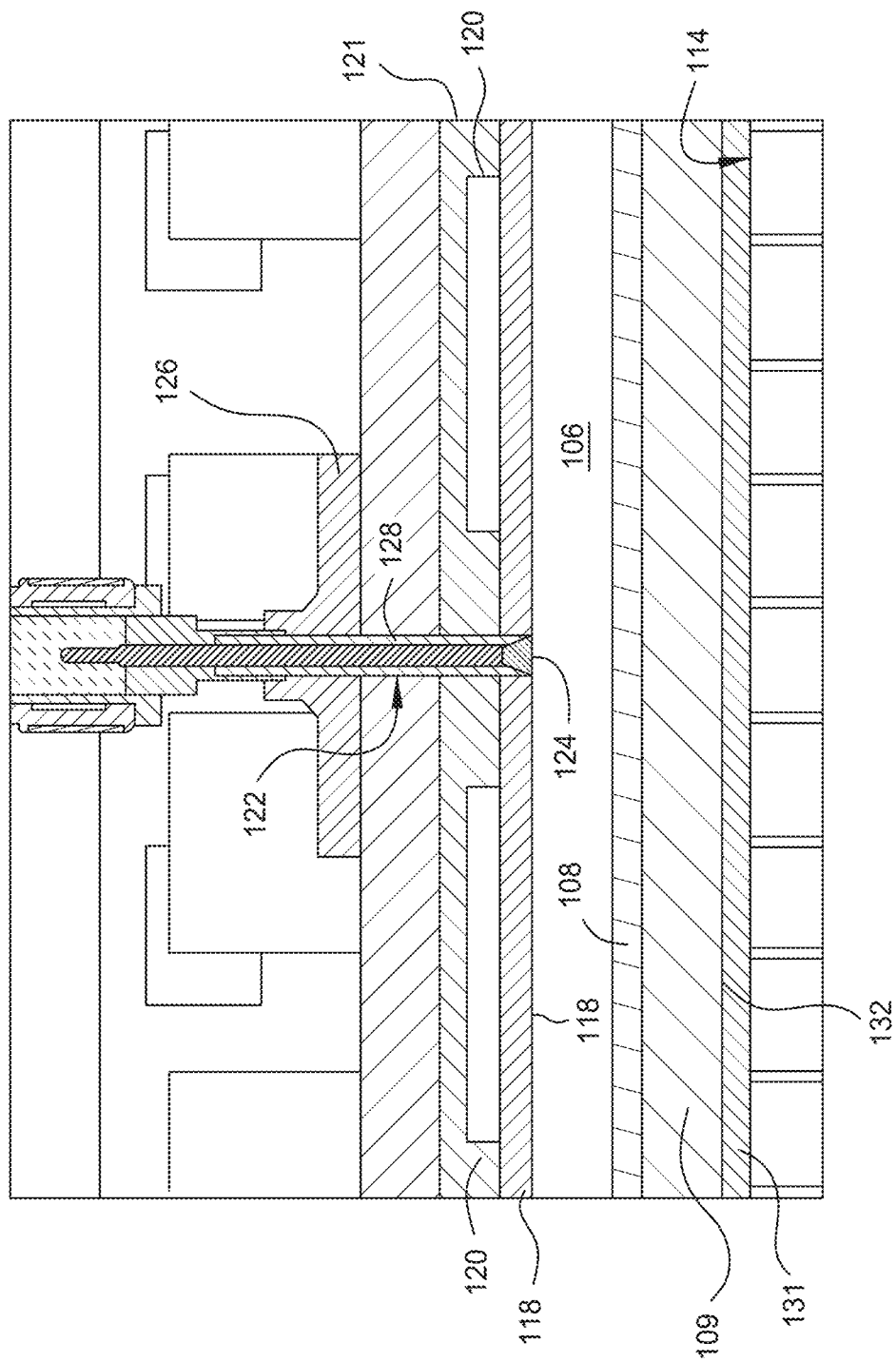
FIG. 1B is an enlarged view of the system shown in FIG. 1A, according to one implementation.

FIG. 1A is a schematic partial cross-sectional view of a system 101 for processing substrates, according to one implementation. FIG. 1B is an enlarged view of the system 101 shown in FIG. 1A, according to one implementation. The system 101 includes a processing chamber 100. The processing chamber 100 may be a rapid thermal processing (RTP) chamber available from Applied Materials, Inc., of Santa Clara, Calif. The processing chamber 100 includes a body 102 formed from, for example, stainless steel or aluminum, and adapted to support a chamber lid 104 thereon. A processing volume 106 is defined between the chamber body 102 and the chamber lid 104. A substrate support 109 is positioned at the lower portion of the processing volume 106 within the chamber body 102. The substrate support 109 is adapted to support a substrate 108, such as a semiconductor substrate, thereon during processing within the process chamber 100. The substrate support 109 may be formed from an optically transparent material, such as quartz, to facilitate the heating of the substrate using optical radiation.

Plenums 110 are coupled to the chamber body 102 and are adapted to provide and remove one or more process gases to/from the processing volume 106 during processing. In one example, a first plenum 110 may be adapted to provide a process gas to the processing volume 106, while a second plenum 111 may be adapted to remove reactant by-products and unreacted process gas from the processing volume 106. Process gas entering the process chamber 100 through a plenum 110 is directed over a pre-heat ring 112 prior to entering the process region 106. The pre-heat ring 112 may be formed from silicon carbide or graphite and facilitates heating of the process gas while providing edge protection to the substrate 108. The pre-heat ring 112 includes a circular opening disposed centrally therethrough. The opening has a diameter less than the substrate 108, such as about 1 millimeter less to about 10 millimeters less, in order to cover the edge of the substrate 108 during processing. The pre-heat ring 112 is actuatable from a process position (as shown in FIG. 1A) and a raised position above the process position which facilitates removal of the substrate 108 from the process chamber 100.

The processing chamber 100 also includes a lamp array 114 disposed in a lower portion of a chamber body 102. The lamp array 114 includes a plurality of lamps 116, such as incandescent lamps, arranged in a close-packed hexagonal array. In some embodiments, which may be combined with other embodiments, it is contemplated that the lamps 116 may be arranged according to a different geometry. The lamp array 114 is adapted to emit optical radiation (e.g., light) towards the substrate 108 to rapidly elevate the temperature of the substrate 108 to a desired processing temperature to conduct an anneal operation on the substrate 108. The lid 104 includes a reflector plate 118 disposed on a lower surface thereof adjacent to the process region 106. The reflector plate 118 is adapted to reflect optical radiation back to the upper surface of substrate 108 to provide more efficient heating of the substrate 108 and facilitate temperature control of the lid 104. To further facilitate temperature control of the lid 104, the lid 104 includes cooling passages 120 formed in a cooling body 121 to allow a cooling fluid to flow therethrough to remove heat from the lid 104 via a heat exchanger (not shown).

The lid 104 includes an opening therethrough to accommodate a probe 122. The probe 122 is a borescope. The opening to accommodate the probe 122 may be centrally disposed relative to the substrate 108 and lamp array 114, or may be offset from the centers thereof. The probe 122 includes optical elements therein to facilitate transferring of an image of the internal chamber volume, for example, including the lamp array 114, to a camera 125, for example one or more CCD cameras. The camera 125 is a monochrome camera. The camera 125 includes a silicon-having sensor. A prism 124 is disposed at the lower end of the probe 122. The present disclosure contemplates that a lens, such as a wide-angle lens, for example a "fish eye" lens, can be used in place of or in addition to the prism 124. The wide-angle lens can be a wide-angle lens assembly that includes a plurality of lenses. The prism 124 has a viewing angle that is 100 degrees or greater, such as within a range of 160 degrees to 170 degrees (for example about 163 degrees) to facilitate viewing of the all the lamps 116 of the lamp array 114 or a majority of the lamps 116 of the lamp array 114. The probe 122 may be formed, for example, from aluminum or an alloy thereof. The probe 122 and the prism 124 are disposed at a perpendicular angle (e.g., a 90 degree angle) relative to a surface 132 of a lamp window 131. The surface 132 is between the processing volume 106 and the lamps 116. The surface 132 faces the processing volume 106. The lamp window 131 is formed of an optically transparent material, such as quartz.

The probe 122 is disposed through the reflector plate 118 and the cooling body 121 and is coupled to the camera 125 to transmit light collected by the prism 124 of the probe 122. A bandpass filter 127 is coupled between the camera 125 and the prism 124 to filter the light collected by the prism 124 to reduce noise of the light in the images captured by the camera 125. The bandpass filter 127 is configured to filter out light having a wavelength equal to or greater than 1.1 microns so that such light is not captured by the camera 125. The bandpass filter 127 filters out light that is outside of visible light and/or near-infrared (near-IR) light. The silicon-having sensor of the camera 125 is sensitive to light having a wavelength that is less than 1.1 microns, such as visible light and/or near-infrared (near-IR) light. The probe 122 is secured in place via a mount housing 126 (such as a bracket) coupled to an upper surface of the lid 104. A seal 128 is disposed around the probe 122 between the probe 122 and the mount housing 126 to mitigate the escape of process gases from the processing region 106. The mount housing 126 can include one or more cooling channels to receive one or more cooling fluids to cool the probe 122 during heating of the lamps 116 and/or processing of the substrate 108. The probe may have a length of about 2 inches to about 1 foot, for example, about 5 inches to about 7 inches, to distance the camera 125 from the process region 106, thereby subjecting the camera 125 to less heat, thus reducing the likelihood of damage to the camera 125.

The camera 125 is adapted to capture a plurality of images of light emitted by the lamps 116 of the lamp array 114 and transfer the images to a controller 130. The camera 125 transmits the plurality of images to the controller 130 in the form of data. The controller 130 includes a central processing unit (CPU) 141, a memory 142 containing instructions, and support circuits 143 for the CPU 141. The controller 130 is of any form of a general-purpose computer processor that is used in an industrial setting for controlling various chambers and equipment, and sub-processors thereon or therein. The memory 142, or non-transitory computer readable medium, is one or more of a readily available memory such as random access memory (RAM), read only memory (ROM), floppy disk, hard disk, flash drive, or any other form of digital storage, local or remote. The support circuits 143 are coupled to the CPU 141 for supporting the CPU 141 (a processor). The support circuits 143 include cache, power supplies, clock circuits, input/output circuitry and subsystems, and the like. Substrate processing parameters and operations are stored in the memory 142 as a software routine that is executed or invoked to turn the controller 120 into a specific purpose controller to control the operations of the system 101. The controller 130 is configured to conduct any of the methods described herein. The instructions stored on the memory 142, when executed, cause one or more of operations 701-705 of method 700 to be conducted.

The controller 130 receives the plurality of images from the camera 125 and analyzes the plurality of images to detect a mean light pixel change in a reference region across the plurality of images. The reference region corresponds to an individual lamp of the lamps 116. The controller 130 generates an alert based on the detection of the mean light pixel change, and the alert indicates a replacement instruction for the respective lamp 116 corresponding to the reference region. The alert indicates that the respective lamp 116 could subsequently fail within a specified time frame, such as within a certain number of weeks or months of operation. Additionally, or alternatively, the alert may instruct an operator to replace the respective lamp 116. The alert may be displayed on a user interface. The instructions in the memory 142 of the controller 130 can include one or more machine learning/artificial intelligence algorithms that can be executed in addition to the operations described herein. As an example, a machine learning/artificial intelligence algorithm executed by the controller 130 can optimize and alter operational parameters based on the analyzed images and/or the detected mean light pixel change. The controller 130 may store data, and compare the analyzed images to stored data to predict a remaining operational life (e.g., an operational life until failure) of one or more of the lamps 116, such as the respective lamp 116 corresponding to the reference region.

The images analyzed by the controller 130 can detect when a tungsten filament of the respective lamp 116 initially sags, causing two adjacent coils of the filament to contact each other. Detecting the initial sagging of individual lamps facilitates predicting a future failure of the respective lamp 116 such that the respective lamp 116 can be replaced before the respective lamp 116 fails, facilitating reduced machine downtime, increased throughput, and enhanced device performance.

The present disclosure contemplates that in addition to, or in place of, the probe 122 shown disposed through the lid 104, the probe 122 or a second probe may be disposed in a second position 133 (shown in ghost in FIG. 1A) such that the prism 124 is below the substrate support 109 and below the lamp window 131. The probe 122 disposed through the lid 104 is used to capture images of the light before the substrate 108 is transferred into the processing chamber 100 or after the substrate 108 is transferred out of the processing chamber 100. In the second position 133, the probe 122 or the second probe captures light (emitted by the lamps 116) that reflects off the backside surface of substrate 108 or reflects off of the reflector plate 118.

Figure 2:
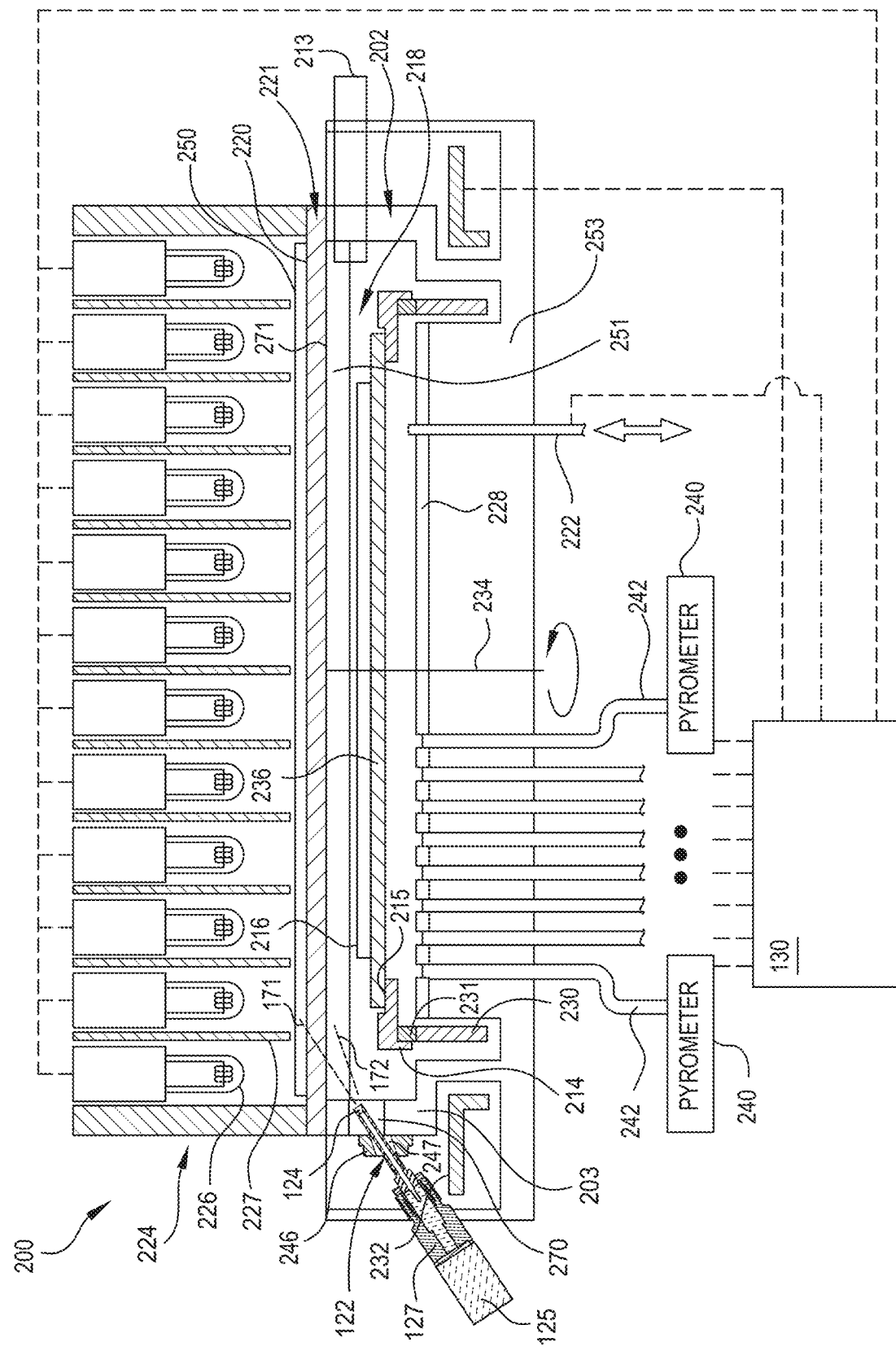
FIG. 2 is a partial schematic cross-sectional view of a processing chamber, according to one implementation.

FIG. 2 is a partial schematic cross-sectional view of a processing chamber 200, according to one implementation. The processing chamber 220 is an anneal chamber, such as a rapid thermal anneal chamber. A substrate 236 to be processed in the processing chamber 200 is provided through a valve (such as a slit valve) or access port 213 into a processing volume 218 of the processing chamber 200. The substrate 236 is supported on a periphery thereof by an annular edge ring 214. The edge ring 214 has an annular sloping shelf 215 contacting the corner of the substrate 236. The substrate 236 is oriented such that processed features 216 already formed on a top surface of the substrate 236 face upwardly toward a radiant heating apparatus 224.

The anneal chamber 200 includes a chamber body 202 and the processing volume 218 disposed within the chamber body 302. The chamber body 202 includes one or more sidewalls 203. The processing volume 218 is defined on an upper side thereof by a transparent quartz window 220. The anneal chamber 200 conducts a rapid thermal anneal operation on the substrate 236. In one embodiment, which can be combined with other embodiments, the rapid thermal anneal operation is capable of uniformly heating the substrate 236 at rates of about 10 degrees Celsius per second and higher, for example at rates of about 10 degrees per second to about 250 degrees per second or higher.

Three lift pins 222 are raised and lowered to engage and support a bottom surface (such as a backside surface) of the substrate 236 when the substrate 236 is handled by a substrate transfer apparatus, such as a robot. A robot blade of the robot and/or a robot arm of the robot extends through the valve or access port 313 to provide the substrate 236 into the anneal chamber 200 and onto the lift pins 222. The substrate 236 is then lowered onto the edge ring 214. In order to heat the substrate 236 in the processing volume 318, the radiant heating apparatus 324 is positioned above the window 320 to direct radiant energy (e.g., light) toward the substrate 236. In the anneal chamber 200, the radiant heating apparatus includes a plurality of lamps 226 (heat lamps) positioned in respective reflective tubes 227 arranged in a hexagonal close-packed array above the window 220. In some embodiments, which may be combined with other embodiments, it is contemplated that the lamps 226 may be arranged according to a different geometry. The plurality of lamps 226 include high-intensity tungsten-halogen lamps having tungsten filaments. The plurality of lamps 226 are positioned above the edge ring 214.

The lamps 226 involve resistive heating to quickly elevate, or ramp up, the temperature of the radiant source to increase the temperatures of the processing volume 218 and the substrate 236. The lamps 226 may include incandescent and tungsten halogen incandescent lamps having an envelope of glass or silica surrounding a filament, and flash lamps which include an envelope of glass or silica surrounding a gas, such as xenon. The lamps 226 may include arc lamps that include an envelope of glass, ceramic, or silica that surrounds a gas or vapor. Such lamps provide radiant heat when the gas is energized. As provided herein, the term lamp is intended to include lamps having an envelope that surrounds a heat source. The "heat source" of a lamp refers to a material or element that can increase the temperature of the substrate 236, for example, a filament (such as a tungsten filament) or gas that may be energized.

A reflector 228 extending parallel to, and over an area greater than, the substrate 236 and facing the bottom surface of the substrate 236 efficiently reflects heat radiation emitted from the substrate 236 back to the substrate 236. In one embodiment, which can be combined with other embodiments, a reflector plate is included to enhance the apparent emissivity of the substrate 236. The reflector 228, which may have a gold coating or multilayer dielectric interference mirror, effectively forms a black-body cavity at the back of the substrate 236 that functions to distribute heat from warmer portions of the substrate 236 to cooler portions. The chamber body 202 includes an upper wall 221 and a lower wall 253. The reflector 228 is disposed on a water-cooled base formed in the lower wall 253 made of a material, such as a metal, chosen for an ability to heat sink excess radiation from the substrate 236, such as during cool down. The upper wall 221 includes the quartz window 220 and a lower wall 253 is substantially parallel to the upper wall 221.

The edge ring 214 is disposed on and supported on a support cylinder 231, and is movable relative to the support cylinder 231 and a rotor 230 upon thermal expansion and/or retraction of the edge ring 214. The edge ring 214 may also be moved using the support cylinder 231 and the rotor 230. The support cylinder 231 may include a thermal insulation material. The support cylinder 231 is supported on, and may be coupled to or formed as part of, the rotor 230. The rotor 230 and the support cylinder 231 are rotatable. The rotor 230 is cylindrical. The rotor 230 is magnetically levitated in the chamber body 202. The rotor 230 is magnetically coupled to a drive ring 232 positioned outside of the one or more sidewalls 203 of the chamber body 202. Gravitational forces and a lower shoulder extending downward from a lower surface of the edge ring 215 facilitate retaining the edge ring 214 on the support cylinder 231 and the rotor 230. In one embodiment, which can be combined with other embodiments, the drive ring 232 is a rotatable flange and is magnetically coupled to the rotor 230 such that the rotor 230 rotates with rotation of the drive ring 232. In such an embodiment, a motor rotates the drive ring 232 to rotate the rotor 230. In one embodiment, which can be combined with other embodiments, the drive ring 232 is fixed relative to the chamber body 202 and includes electrical coils that, when powered, generate magnetic forces to magnetically rotate and/or levitate the rotor 230. When the rotor 230 rotates, the edge ring 214 and the substrate 236 supported on the edge ring 214 rotate about a center axis 234 of the substrate 236.

The lamps 226 may be divided into heating zones arranged in a generally ring-like formation about the center axis 234. Control circuitry varies the voltage delivered to the lamps 226 in the different zones to thereby tailor the radial distribution of radiant energy. One or more pyrometers 240 are coupled through one or more optical light pipes 242 positioned to face the bottom surface of the substrate 236 through apertures in the reflector 228. The one or more pyrometers 240 measure the temperature across a radius of the stationary or rotating substrate 236. The light pipes 242 may be formed of various structures including sapphire, metal, and silica fiber. The pyrometers 240 are disposed below the edge ring 214, and the edge ring 214 is disposed between the pyrometers 240 and the plurality of lamps 226. In one embodiment, which can be combined with other embodiments, a film of reflective coating 250 may be disposed on the side of the window 220 facing the lamps 226. In one embodiment, which can be combined with other embodiments, a reflective coating 251 is disposed on the side of the window 220 facing the substrate 236. In the implementation shown in FIG. 2, a reflective coating 250 and 251 is disposed on both sides of the window 220. The reflective coating 250 and 251 facilitates blocking radiation in the pyrometer bandwidth from propagating through the reflective coating 250 and 251 to facilitate accurate measurements of the pyrometers 240.

One or more cameras 125 (one is shown in FIG. 2) are coupled to one or more probes 122 (one is shown in FIG. 2) that are disposed through the one or more sidewalls 203, such as through a transparent quartz window 270 of the one or more sidewalls 203. The prism 124 of the probe 122 is pivotable relative to the probe 122. The prism 124 is a transparent prism, such as a corner cube prism, that refracts light collected through the prism 124. The prism 124 can be conical, frustoconical, pyramidal, trapezoidal, and/or triangular in shape. The surface 271 faces the processing volume 218. Each probe 122 is movable, such as slidable and/or pivotable, relative to a respective mount housing 246 that is similar to the mount housing 126. An opening in the respective mount housing 246 can be angled to facilitate orienting the probe 122 in an angled position. A central axis 171 of the prism 124 and the probe 122 is movable and pivotable relative to a central axis 172 of a mount opening 247 of the respective mount housing 246. The central axis 171 extends through a center of the prism 124 that points toward the lamps 226. The central axis 171 of the prism 124 and the probe 122 is disposed at an oblique angle (such as 30 degrees) relative to the central axis 172 of the mount opening 247, or the central axis 171 is parallel (e.g., coaxial) to the central axis 172. The prism 124 (such as the central axis 171) is oriented at an oblique angle or a perpendicular angle relative to a surface 271 of the lamp window 220 disposed between the processing volume 218 and the plurality of lamps 226.

FIG. 2 shows the central axis 171 of the prism 124 and the probe 122 at an oblique angle (such as 30 degrees) relative to the central axis 172 of the mount opening 247. FIG. 2 shows the central axis 171 of the prism 124 and the probe 122 at an oblique angle relative to the surface 271. The probe 122 and the prism 124 are oriented upward towards the lamps 226 in FIG. 2 to collect light emitted by the lamps 226 to capture images of the light using the camera 125. The controller 130 receives the plurality of images from the camera 125 and analyzes the plurality of images to detect a mean light pixel change in one or more reference region across the plurality of images. Each reference region corresponds to an individual lamp of the lamps 226. The controller 130 generates an alert based on the detection of the mean light pixel change, and the alert indicates a replacement instruction for the respective lamp 226 corresponding to the reference region. The alert indicates that the respective lamp 226 could subsequently fail within a specified time frame, such as within a certain number of weeks or months of operation. Additionally, or alternatively, the alert may instruct an operator to replace the respective lamp 226. The alert may be displayed on a user interface. Disposing the one or more probes 122 and the one or more prisms 124 at least partially through the one or more sidewalls 203 (as shown in FIG. 2) facilitates using the one or more cameras 125 to optically monitor the lamps 226 and generate the alert during processing of the substrate 236, reducing or eliminating obstruction of the one or more cameras 125 by the substrate 236. The angled orientations of the probe 122 and the prism 124 shown in FIG. 2 facilitate accurately monitoring the lamps 226 and predicting failure of individual lamps during substrate processing, with reduced obstruction by the substrate 236.

Figure 3:
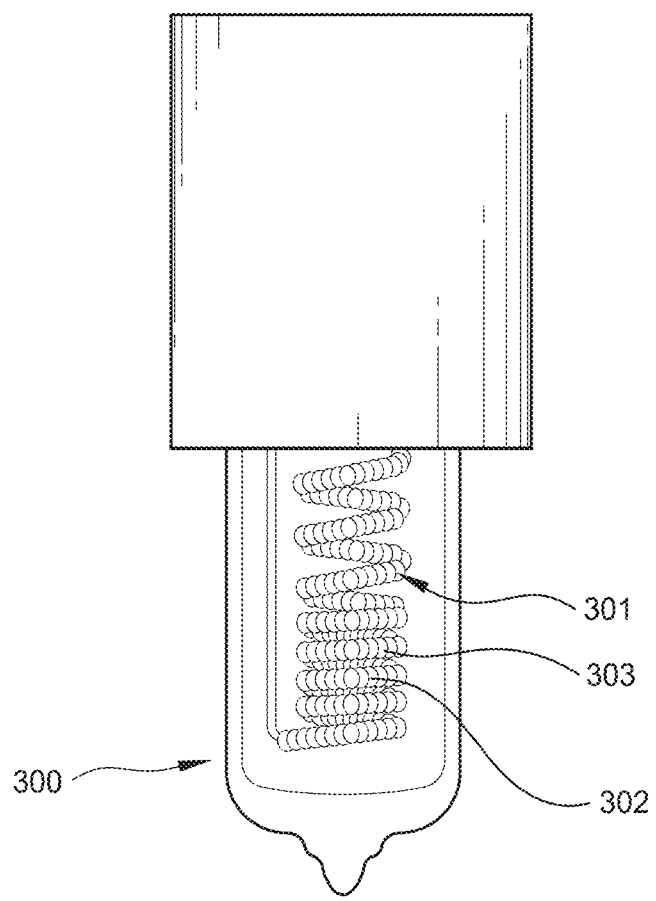
FIG. 3 is a schematic view of a lamp that includes coils in a sagged position, according to one implementation.

FIG. 3 is a schematic view of a lamp 300 that includes coils in a sagged position, according to one implementation. The lamp 300 includes a filament 301, such as a tungsten filament, wound into a plurality of coils. In the sagged position, certain adjacent coils are separated by distance that is less than a separation between other adjacent coils. In an example, as illustrated, two coils 302, 303 of the filament 301 contact each other (i.e. zero separation).

Figure 4:
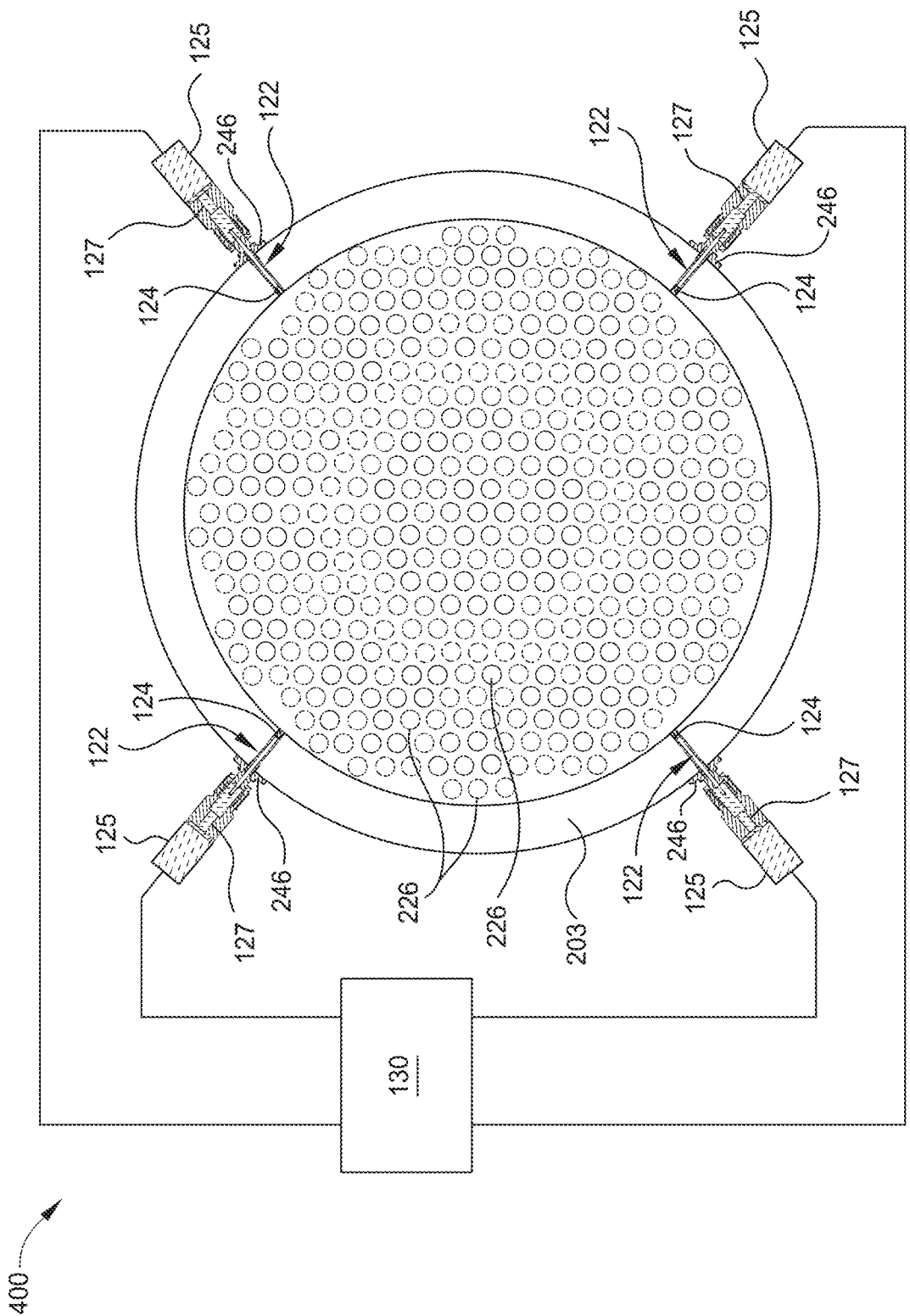
FIG. 4 is a schematic partial bottom view of a system for processing substrates, according to one implementation.

FIG. 4 is a schematic partial bottom view of a system 400 for processing substrates, according to one implementation. The system 400 includes a plurality of cameras 125 (four are shown), each camera 125 coupled to one of a plurality of probes 122 (four are shown), and each probe 122 having one of a plurality of prisms 124 (four are shown) coupled thereto. In another example, the system 400 includes two cameras 125, two corresponding probes 122, and two corresponding prisms 124. In another example, the system 400 includes three cameras 125, three corresponding probes 122, and three corresponding prisms 124. In other examples, the system 400 includes more than four cameras 125, corresponding probes 122, and corresponding prisms 124.

The probes 122 and the prisms 124 are disposed at least partially through the one or more sidewalls 203 (one sidewall 203 is shown) of the processing chamber 200 shown in FIG. 2. In an example, two of the probes 122 and cameras 125 are disposed on two opposing sides of the one or more sidewalls 203 of the processing chamber 200, as shown in FIG. 4. Other arrangements are contemplated. For example, three probes 122 and corresponding cameras 125 may be disposed at least partially through the one or more sidewalls 203. Additionally, adjacent probes 122 with corresponding cameras 125 may be disposed at intervals from 45 degrees to 180 degrees around a circumference of the processing chamber 200.

Each of the prisms 124 has a viewing angle of 100 degrees or greater such that each and every one of the lamps 226 is within a viewing range of at least one of the prisms 124. In an example, one or more first lamps 226 is within a viewing range of a single prism 124, and one or more second lamps 226 is within the viewing ranges of more than one prism 124. In some embodiments, which may be combined with other embodiments, each and every one of the lamps 226 is within the viewing ranges of more than one prism 124. In an example, each and every one of the lamps 226 is within the viewing ranges of at least two prisms 124.

Figure 5:
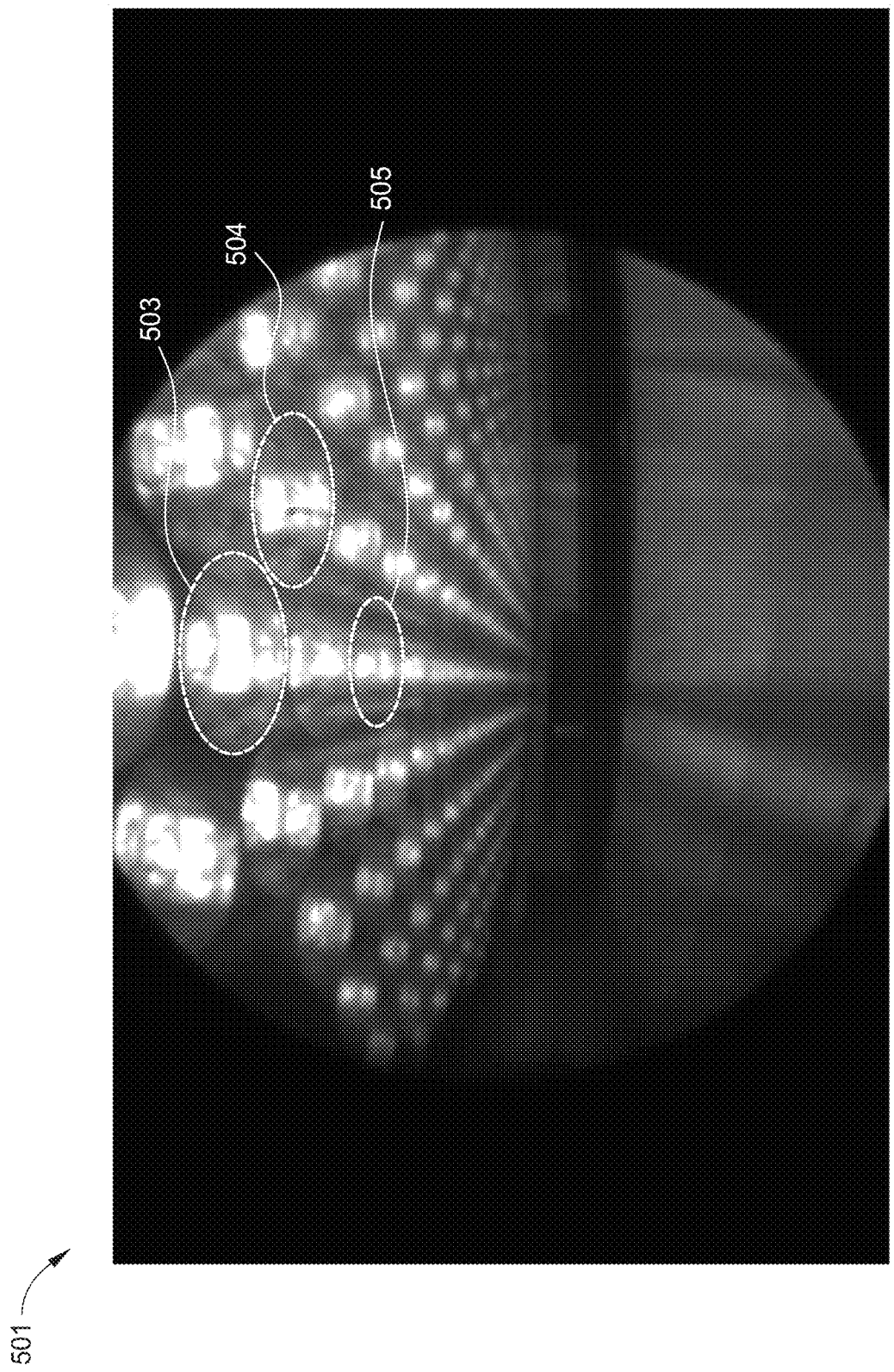
FIG. 5 is a schematic view of an image taken by one of the cameras shown in FIG. 4, according to one implementation.

FIG. 5 is a schematic view of an image 501 taken by one of the cameras 125 shown in FIG. 4, according to one implementation. The image 501 includes a plurality of reference regions 503-505. The present disclosure acknowledges that reference regions(s) can be referred to as region(s) of interest (ROI(s)). Each of the reference regions 503-505 is defined to correspond to one of the lamps 226. Each of the reference regions 503-505 includes light pixels that corresponds to light emitted by the respective lamp 226 that corresponds to the respective reference region 503-505. For each cycle (e.g., the lamps 226 being turned off for a period of time and then turned off), a plurality of images 501 are captured and a mean light pixel intensity is determined for each cycle by the controller 130 for the light pixels falling within the respective reference region 503-505. The mean light pixel intensity is a numerical mean calculated for the light pixels falling within the respective reference region 503-505 across a plurality of images 501 within a single cycle. In an example, the numerical mean is an arithmetic mean, In another example, the numerical mean is a geometric mean. In a further example, the numerical mean is a harmonic mean.

Figure 6:
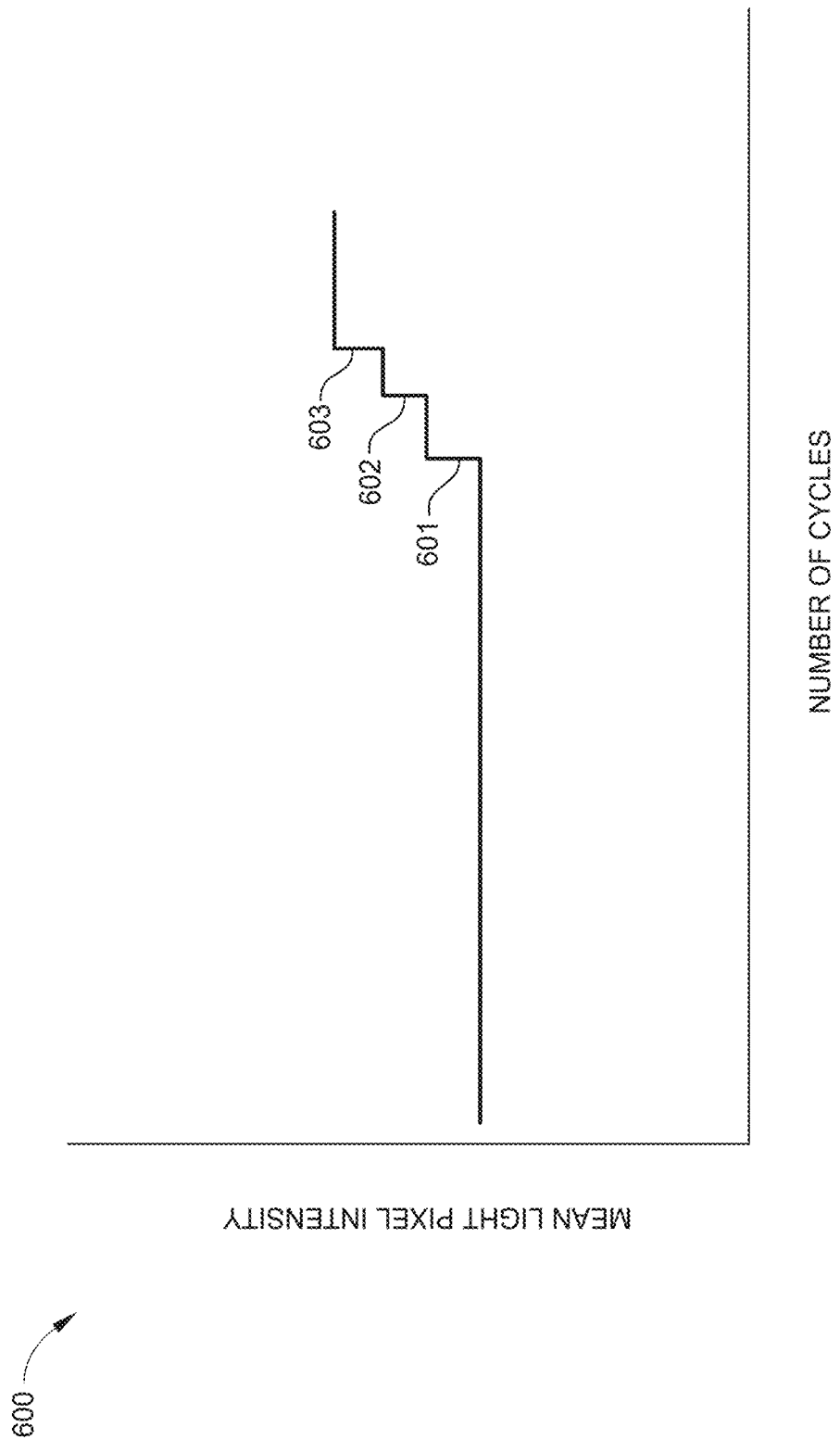
FIG. 6 is a schematic graph of the mean light pixel intensity graphed versus the number cycles for a respective reference region, according to one implementation.

FIG. 6 is a schematic graph 600 of the mean light pixel intensity versus the number cycles for a respective reference region, according to one implementation. The graph 600 includes a plurality of mean light pixel changes 601-603 for the respective reference region. The controller 130 generates the alert indicating the replacement instruction if at least one of the mean light pixel changes 601-603 exceeds a noise level (which can be about 1%) for the graph 600, for example if at least one of the mean light pixel changes 601-603 is 5% or greater. A constant power current is supplied to the respective lamp 226 across the graph 600.

Figure 7:
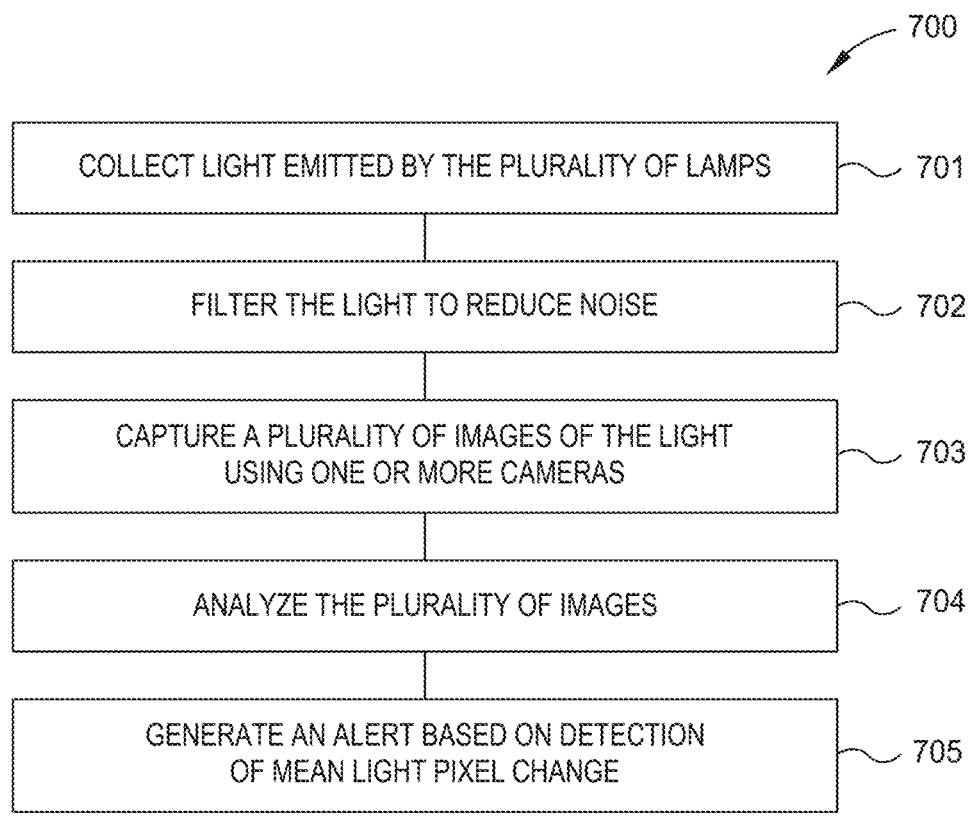
FIG. 7 is a block diagram of a method of monitoring a plurality of lamps of a processing chamber, according to one implementation.

FIG. 7 is a block diagram of a method 700 of monitoring a plurality of lamps of a processing chamber, according to one implementation. Operation 701 includes collecting light emitted by the plurality of lamps through a prism. Operation 702 includes filtering the light collected through the prism to reduce noise. The light collected through the prism is filtered using a bandpass filter coupled between the respective camera and the prism. The bandpass filter filters out light having a wavelength that is equal to or greater than 1.1 microns.

Operation 703 includes capturing a plurality of images of the light using one or more cameras. The plurality of images are captured at a plurality of exposure times. Each of the plurality of images includes a plurality of reference regions. Each of the plurality of reference regions corresponds to a respective lamp of the plurality of lamps. Each respective camera of the one or more cameras is coupled to a borescope that includes a prism oriented at an oblique angle or a perpendicular angle relative to a surface of a lamp window disposed between a processing volume of the processing chamber and the plurality of lamps. The surface of the lamp window faces the processing volume. During the capturing of the images, the exposure times are adjusted to account for higher irradiance at the silicon-having sensor of the camera from lamps that are closer to the prism. In some embodiments, which may be combined with other embodiments, the exposure times are adjusted throughout the capturing of the images. The exposure times are increased for the plurality of reference regions the farther the corresponding lamps (which correspond to the reference regions) are located relative to the prism.

Operation 704 includes analyzing the plurality of images. The analyzing the plurality of images includes determining a mean light pixel intensity in each of the plurality of reference regions for each of the plurality of images. In an example, the mean is an arithmetic mean, In another example, the mean is a geometric mean. In a further example, the mean is a harmonic mean. The analyzing the plurality of images also includes detecting a mean light pixel change in a reference region of the plurality of reference regions. The mean light pixel change is a change in the mean light pixel intensity across the plurality of images for the reference region. The mean light pixel change is larger than a noise level across the plurality of images for the reference region. The mean light pixel change indicates a deterioration, such as an initial sagging (e.g., a first sagging), of the respective lamp that corresponds to the reference region, prior to actual failure of the respective lamp. Using the mean light pixel change within a reference region across the plurality of images facilitates accurately predicting a failure of individual lamps (rather than zones of lamps or pairs of lamps) before the failure occurs, and facilitates reduced interference of noise with the optical monitoring.

The mean light pixel change for the respective reference region can be determined by comparing a new mean light pixel intensity to an existing mean light pixel intensity (e.g., a known intensity or a reference intensity). The existing mean light pixel intensity can be a predetermined value or can be determined from an existing image (e.g., a reference image) that was previously taken, such as when the lamp corresponding to the respective reference region was first used. The existing mean light pixel intensity can be determined by averaging a plurality of existing images for the respective reference region and/or averaging a plurality of existing light pixel intensities determined using a plurality of existing images.

Operation 705 includes generating an alert based on the detection of the mean light pixel change. The alert indicates a replacement instruction for the respective lamp corresponding to the reference region. In some embodiments, which can be combined with other embodiments, the replacement instruction instructs an operator (such as on a display of a user interface) to replace the respective lamp corresponding to the reference region. The operator can then replace the respective individual lamp without necessarily replacing any other lamp to reduce machine downtime, reduce costs and resource expenditure, and increase throughput of substrates by the processing chamber. The respective individual lamp can be replaced before the lamp actually fails. In some embodiments, which can be combined with other embodiments, the replacement instruction provides the operator with an estimate of the remaining life, such as the remaining useful life, of the respective lamp. The operator may use such remaining life estimates for each lamp in order to plan and execute appropriate maintenance activities to reduce machine downtime, reduce costs and resource expenditure, and increase throughput of substrates by the processing chamber.

Figure 8:
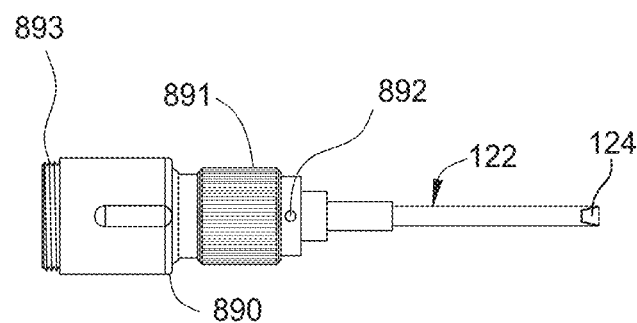
FIG. 8 is a schematic side view of the probe (shown in FIGS. 1A and 2B) coupled to optics of the camera (shown in FIG. 1A).

FIG. 8 is a schematic side view of the probe 122 (shown in FIGS. 1A and 2B) coupled to optics 890 of the camera 125 (shown in FIG. 1A). The probe 122 may be coupled to a focusing section 891 of the optics 890, and secured via a set screw 892. The optics 890 may be secured to the camera 125 via threads 893. The focusing section 891 may provide a depth of focus at a plane of the lamps 116 or the lamps 226, for example, to increase the accuracy of the lamp monitoring by ignoring or not collecting undesired light (e.g., IR radiation or reflection), for example, from other chamber components. The present disclosure contemplates that the bandpass filter 127 (shown in FIG. 1A) can be disposed at least partially in the optics 890, such as between the camera 125 and the focusing section 891. The present disclosure contemplates that the optics 890, the focusing section 891, the set screw 892, and the threads 893 can be used with the probe 122, the camera 125, and the prism 124 of the system 101, the processing chamber 200, and/or the system 400.

Benefits of the present disclosure include optically monitoring light emitted by lamps during substrate processing; reduced obstruction of substrates with optically monitoring light emitted by lamps; accurately predicting lamp failure for individual lamps, rather than zones of lamps or pairs of lamps; reduced machine downtime; accurate monitoring; reduced maintenance expenditure of resources; increased throughput of substrates by a processing chamber; and enhanced device performance, such as energy efficiency.

It is contemplated that one or more aspects disclosed herein may be combined. As an example, one or more aspects, features, components, operations, and/or properties of the system 101, the processing chamber 200, the lamp 300, the system 400, the image 501, the schematic graph 600, and/or the method 700 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A method of monitoring a plurality of lamps of a processing chamber, comprising:
   collecting light emitted by the plurality of lamps;
   filtering the light to reduce noise;
   capturing a plurality of images of the light using one or more cameras, each of the plurality of images comprising a plurality of reference regions, each of the plurality of reference regions corresponding to a respective lamp of the plurality of lamps;
   analyzing the plurality of images, the analyzing comprising:
     determining a mean light pixel intensity in each of the plurality of reference regions for each of the plurality of images, and
     detecting a mean light pixel change in a reference region of the plurality of reference regions, the mean light pixel change being a change in the mean light pixel intensity across the plurality of images for the reference region, the mean light pixel change being larger than a noise level across the plurality of images for the reference region; and
   generating an alert based on the detection of the mean light pixel change.

2. The method of claim 1, wherein the alert indicates a replacement instruction for the respective lamp corresponding to the reference region.

3. The method of claim 1, wherein the alert indicates an estimated remaining life of the respective lamp corresponding to the reference region.

4. The method of claim 1, wherein each camera of the one or more cameras is coupled to a corresponding borescope that includes a prism oriented at an oblique angle or a perpendicular angle relative to a surface of a lamp window disposed between a processing volume of the processing chamber and the plurality of lamps, the surface facing the processing volume.

5. The method of claim 4, wherein the light is filtered using a bandpass filter coupled between each camera and the corresponding prism.

6. The method of claim 5, wherein each camera is a monochrome camera.

7. The method of claim 6, wherein each prism has a field of view of 100 degrees or more.

8. The method of claim 7, wherein the one or more cameras comprise cameras disposed on different sides of the processing chamber.

9. The method of claim 8, wherein the one or more cameras comprise two cameras disposed on a first side of the processing chamber and two cameras disposed on a second side of the processing chamber, the first side opposing the second side.

10. The method of claim 7, wherein the capturing the plurality of images comprises adjusting a plurality of exposure times.

11. The method of claim 10, wherein a selected camera of the one or more cameras captures a first image of the plurality of images at a first exposure time, and captures a second image of the plurality if images at a second exposure time, the second exposure time different from the first exposure time.

12. The method of claim 11, wherein the first exposure time is selected according to a detected irradiance of a first lamp of the plurality of lamps, and the second exposure time is selected according to a detected irradiance of a second lamp of the plurality of lamps.

13. The method of claim 12, wherein the first lamp is closer than the second lamp to the selected camera of the one or more cameras.

14. A system for processing substrates, comprising:
a processing chamber comprising a processing volume;
a plurality of lamps coupled to the processing chamber;
a lamp window disposed between the plurality of lamps and the processing volume, the lamp window comprising a surface that faces the processing volume;
one or more cameras, each camera of the one or more cameras coupled to a corresponding borescope disposed through a sidewall of the processing chamber, each borescope including a prism; and
a controller comprising instructions that, when executed by a processor, cause:
the prism to collect light emitted by the plurality of lamps;
a bandpass filter to filter the light to reduce noise;
the one or more cameras to capture a plurality of images of the light, each of the plurality of images comprising a plurality of reference regions, each of the plurality of reference regions corresponding to a respective lamp of the plurality of lamps;
the controller to analyze the plurality of images, the analyzing comprising:
determining a mean light pixel intensity in each of the plurality of reference regions for each of the plurality of images, and
detecting a mean light pixel change in a reference region of the plurality of reference regions, the mean light pixel change being a change in the mean light pixel intensity across the plurality of images for the reference region, the mean light pixel change being larger than a noise level across the plurality of images for the reference region; and
the controller to generate an alert based on the detection of the mean light pixel change.

15. The system of claim 14, wherein the alert indicates a replacement instruction for the respective lamp corresponding to the reference region.

16. The system of claim 14, wherein the alert indicates an estimated remaining life of the respective lamp corresponding to the reference region.

17. The system of claim 14, wherein the one or more cameras comprise cameras disposed on different sides of the processing chamber.

18. The system of claim 14, wherein each prism is oriented at an oblique angle or a perpendicular angle relative to the surface of the lamp window.

19. The system of claim 18, wherein the instructions, when executed by the processor, further cause the one or more cameras to adjust a plurality of exposure times.

20. A non-transitory computer readable storage medium having stored thereon, computer-executable instructions that, when executed by a processor, cause the processor to perform a method of monitoring a plurality of lamps of a processing chamber, the method comprising:
collecting light emitted by the plurality of lamps;
filtering the light to reduce noise;
capturing a plurality of images of the light using one or more cameras, each of the plurality of images comprising a plurality of reference regions, each of the plurality of reference regions corresponding to a respective lamp of the plurality of lamps;
analyzing the plurality of images, the analyzing comprising:
determining a mean light pixel intensity in each of the plurality of reference regions for each of the plurality of images, and
detecting a mean light pixel change in a reference region of the plurality of reference regions, the mean light pixel change being a change in the mean light pixel intensity across the plurality of images for the reference region, the mean light pixel change being larger than a noise level across the plurality of images for the reference region; and
generating an alert based on the detection of the mean light pixel change.

* * * * *